(12) United States Patent
Yoshida et al.

(10) Patent No.: US 7,064,623 B2
(45) Date of Patent: Jun. 20, 2006

(54) COAXIAL LINE TYPE COMPONENTS WITH LOW CHARACTERISTIC IMPEDANCE

(75) Inventors: Shiro Yoshida, Tokyo (JP); Hirokazu Tohya, Tokyo (JP); Masayuki Shimizu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/476,843

(22) PCT Filed: Apr. 25, 2002

(86) PCT No.: PCT/JP02/04154

§ 371 (c)(1),
(2), (4) Date: Nov. 6, 2003

(87) PCT Pub. No.: WO02/091515

PCT Pub. Date: Nov. 14, 2002

(65) Prior Publication Data

US 2004/0150494 A1    Aug. 5, 2004

(30) Foreign Application Priority Data

May 8, 2001    (JP)    ............................. 2001-136955

(51) Int. Cl.
*H03H 7/01* (2006.01)
(52) U.S. Cl. ......................................... 333/12; 333/182
(58) Field of Classification Search ................ 333/12, 333/182, 184, 185
See application file for complete search history.

(56) References Cited

U.S. PATENT DOCUMENTS 3,588,758 A * 6/1971 Hurst ........................ 333/183
3,764,943 A * 10/1973 Fort ........................... 333/182
4,275,945 A * 6/1981 Krantz et al. ............... 439/608
6,646,523 B1 * 11/2003 Arai et al. .................. 333/184

FOREIGN PATENT DOCUMENTS

| FR | 2 637 127 A1 | 3/1990 |
| JP | 09-139573 A | 5/1997 |
| JP | 11-040915 A | 2/1999 |
| JP | 2000-100657 A | 4/2000 |
| JP | 2001-053449 A | 2/2001 |

(Continued)

OTHER PUBLICATIONS

Tohya et al., "Power De-coupling Technology for High Speed Digital Circuits", *The Institute of Electrical Engineers of Japan*, vol. MAG-00, No. 167-177, 2000, pp. 13-18, with English Abstract.

(Continued)

*Primary Examiner*—Benny T. Lee
(74) *Attorney, Agent, or Firm*—Sughrue Mion, PLLC

(57) ABSTRACT

Transmission line type components (1, 1'), which form coaxial lines having a very low characteristic impedance by coaxially installing a cylindrical outer conductor made of a conductive material being larger in diameter than an inner conductor so as to cover via a high dielectric insulating material the surface of an inner conductor made of a conductive material, are inserted in series between a power supply line (8) and a ground line (9) connected with a dc source on a printed circuit board and an LSI (6) power supply port, whereby almost the entire high-frequency power supply current generated from the LSI (6) is reflected off the LSI (6) power supply port, and part of the high-frequency power supply current intruding into the components (1, 1') is consumed and does not reach the external power supply line (8).

14 Claims, 7 Drawing Sheets

FOREIGN PATENT DOCUMENTS

JP  2001-274314 A  10/2001
JP  2002-043760 A  2/2002

OTHER PUBLICATIONS

H. Estevez, et al.; "A Method for Approximating the Characteristics Impedance of Coaxial Lines in Which the Inner Conductor Is Circular and the Polygonal"; IEEE Transactions on Microwave theory and Techniques, IEEE Inc., New York, US; vol. 37, No. 3, Mar. 1, 1989: pp. 634-637.

J. M. Bulson; "Low-Impedance Cable for Parallel-Connected Surge Protective Devices"; IEEE Transactions on Power Delivery, IEEE Inc., New York, US; vol. 10, No. 4, Oct. 1, 1995; pp. 1816-1821.

S. Yoshida, et al.; "Novel Decoupling circuit Enabling Notable Noise Suppression in Digital Printed Circuit Board"; NEC Research and Development, Nippon Electric Ltd., Tokyo, Japan; vol. 39, No. 2, Apr. 1998; pp. 88-94.

* cited by examiner

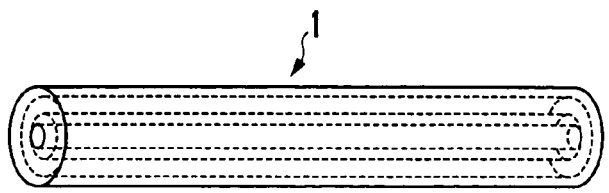
FIG.1A
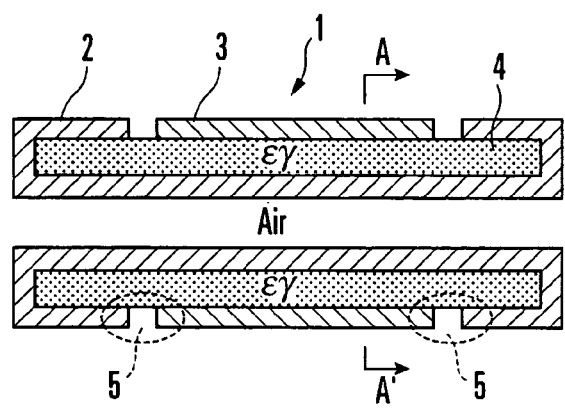 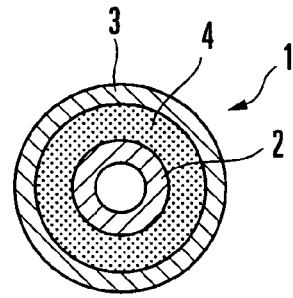
FIG.1B  FIG.1C
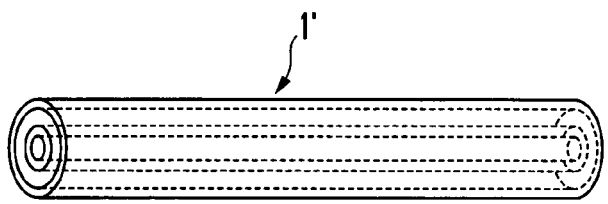
FIG.2A
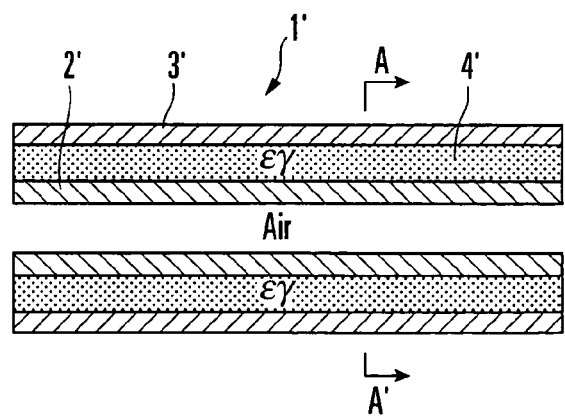 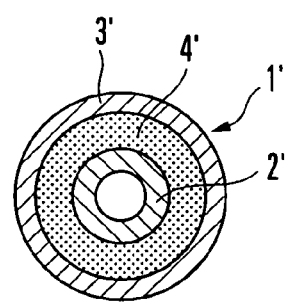
FIG.2B  FIG.2C

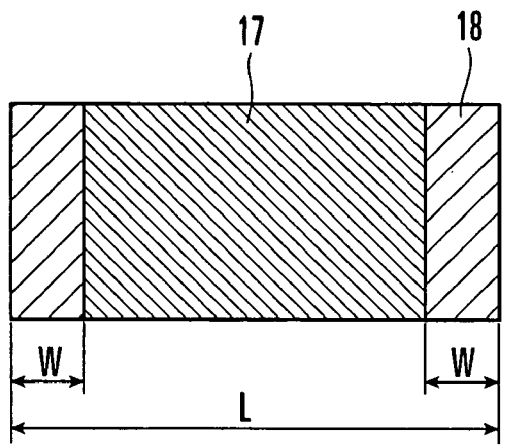
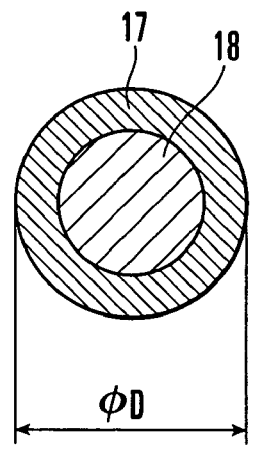
FIG.3A   FIG.3B
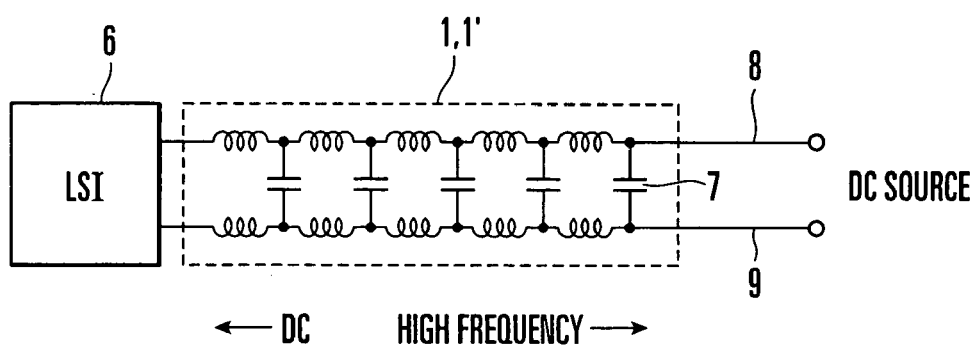
FIG.4

COAXIAL LINE TYPE COMPONENTS WITH LOW CHARACTERISTIC IMPEDANCE

BACKGROUND ART

The present invention relates to a transmission line type component which is an electronic component suitable as a high frequency decoupling device (a decoupling component, i.e., a so called decoupler) mainly in a semiconductor switching circuit and is mounted as a power supply line of a digital printed circuit board or semiconductor package having high speed, high frequency circuit elements.

As is well known, printed circuit boards having high speed, high frequency circuit elements represented by, e.g., an LSI (Large Scale Integrated) circuit conventionally have such a problem that electromagnetic noise generated from the circuit board induces electromagnetic interference or EMI (Electromagnetic Interference), and this causes an operation error in the electronic device that has the board or in another electronic device.

An especially large part of generated electromagnetic noise is electromagnetic noise called common mode noise which is caused by a high frequency source generated on the basis of a large land surface or ground surface called a common mode and serving as a reference potential. Common mode noise may be generated as a result of many possible reasons. In addition, the mechanism that generates common mode noise is complex, and it is difficult to take an effective measure at a portion near the generation source. Normally, a leakage preventing measure or a radiation preventing measure is taken for a cable that serves as a main propagation line or radiation antenna of common mode noise.

On the other hand, recent studies reveal that one of the major causes of common mode noise in a high speed digital circuit is the high frequency power supply current of a high speed, high frequency circuit element mounted on a printed circuit board. Techniques have also been developed to obtain an effect for suppressing EMI caused by the high frequency power supply current of such a high speed, high frequency circuit element. Examples of known techniques are a multilayered printed board disclosed in Japanese Patent Laid Open No. 9 139573 and a printed wiring board disclosed in Japanese Patent Laid Open No. 11 40915.

In these techniques, DC power supply for a high speed, high frequency circuit element mounted on a printed circuit board is accomplished by providing a line which has an inductor with a high impedance in a high frequency mode inserted midway or a line (to be referred to as a decoupling inductor hereinafter) having a high characteristic impedance and a magnetic body inserted midway, and accordingly, a capacitor (to be referred to as a bypass capacitor hereinafter) is connected between the power supply line and the ground line of the high speed, high frequency circuit element to smoothly execute high speed, high frequency operation in the high speed, high frequency circuit element, and meanwhile, prevent a high frequency power supply current, which is generated in accordance with the operation, from diffusing to the entire circuit board.

FIG. 10 shows the basic arrangement of a conventional decoupling circuit having an EMI suppressing effect (an equivalent circuit representing the technical principle of the EMI suppressing effect disclosed in Japanese Patent Laid Open No. 9 139573).

In this decoupling circuit, in an LSI 6 whose input and output sides are connected to a DC power supply 10 respectively through a power supply line 8 and ground line 9, a decoupling inductor 22 made of a coil L is inserted to the power supply line 8. In addition, a bypass capacitor 19 having an electrostatic capacitance C is inserted between the power supply line 8 and the ground line 9, thereby constituting a power supply circuit.

The above described measure against a high frequency power supply current, including such a decoupling circuit (power supply circuit), is appropriate from the technical viewpoint. Practically, however, a high frequency power supply current that is substantially generated in accordance with the high speed, high frequency operation of the high speed, high frequency circuit element is not taken into consideration (generation of a high frequency power supply current or a technique for suppressing it is not disclosed at all). To practice the measure, the parameters of the decoupling inductor and bypass capacitor must be designed for each LSI. Furthermore, a commercially available capacitor can hardly be applied because commercially available capacitors do not have characteristics which can adequately accommodate an increase in speed of an LSI.

On the other hand, for such power supply circuits, research and development of techniques that can be used for the time being as measures against a high frequency power supply current and can relatively easily be put into practice in place of the above described decoupling circuit (power supply circuit) are progressing because of the necessity for increasing the operation speed of digital circuits, although there are many problems. An example of a known technique that is supposed to be associated with such a technique is a multilayered printed circuit board incorporating a high-k dielectric and having a DC power supply line, which is proposed in Japanese Patent Application No. 11 229525.

In this technique, a DC power supply whose internal impedance has a sufficiently small value over a wide frequency band, which is an ideal power supply form for a high speed, high frequency circuit element such as an LSI mounted on a printed circuit board, is arranged for each high speed, high frequency circuit element so that a high frequency power supply current generated in accordance with the high speed, high frequency operation of the high speed, high frequency circuit element can flow smoothly, and as a consequence, the distortion of signal waveform can be suppressed. In addition, the voltage is stabilized by sharing the DC power supply, thereby eliminating interference between the high speed, high frequency circuit elements.

FIG. 11 is a plan view showing the arrangement of main part of the conventional multilayered printed circuit board incorporating a high-k dielectric and having a DC power supply line, which has an EMI suppressing effect (a printed circuit board proposed in Japanese Patent Application No. 11 229525).

In this multilayered printed circuit board incorporating a high-k dielectric, seven LSIs 6h, 6i, 6j, 6k, 6l, 6m, and 6n are connected to one DC power supply 10 arranged at a corner portion through seven power supply lines 8o, 8p, 8q, 8r, 8s, 8t, and 8u formed by different conductor patterns. In addition, seven bypass capacitors 19a, 19b, 19c, 19d, 19e, 19f, and 19g surface mounted and grounded are connected to the LSIs 6h, 6i, 6j, 6k, 6l, 6m, and 6n, respectively.

FIG. 12 is a side sectional view showing the basic structure of main part of the multilayered printed circuit board incorporating a high-k dielectric.

This multilayered printed circuit board incorporating a high-k dielectric has a structure in which a power supply layer that constructs a power supply line 8 is sandwiched from both sides by ground plane layers that construct ground lines 9 via high-k insulating member layers by high-k insulating members 4, and this portion is sandwiched from both sides by signal layers 20 via prepreg insulating layers 21. With this structure, a line structure having a low impedance is implemented.

In this multilayered printed circuit board incorporating a high-k dielectric as well, a high frequency power supply current generated in accordance with the high speed, high frequency operation of a high speed, high frequency circuit element or a technique for suppressing it is not disclosed. In addition, the high frequency characteristic of the decoupling inductor and bypass capacitor can be regarded as insufficient. Nevertheless, the multilayered printed circuit board incorporating a high-k dielectric can be practically employed with relative ease to avoid the influence of high frequency power supply current. As a characteristic feature, the multilayered printed circuit board incorporating a high-k dielectric has the power supply lines 8o, 8p, 8q, 8r, 8s, 8t, and 8u which do not largely depend on the types of the LSIs 6h, 6i, 6j, 6k, 6l, 6m, and 6n or utilization conditions and allow the high speed, high frequency operation of the LSIs 6h, 6i, 6j, 6k, 6l, 6m, and 6n.

In the above described decoupling circuit or multilayered printed circuit board incorporating a high-k dielectric, which has an EMI suppressing effect, the characteristics of the bypass capacitor introduced into the decoupling circuit are problematic because improvements in the material technology and structural technology are considerably delayed as compared to the increase in speed and frequency in a high speed, high frequency circuit element such as an LSI. The high-k insulating material used in the multilayered printed circuit board incorporating a high-k dielectric must be partially used, unlike the prepreg insulating material of a normal printed circuit board mainly containing a glass epoxy resin. The current printed circuit board manufacturing process must be largely changed, and considerably long time is necessary for practice. That is, either technique cannot easily and appropriately avoid the influence of a high frequency power supply current generated in the high speed, high frequency operation mode of a high speed, high frequency circuit element.

The problem of the characteristics of the bypass capacitor will be described in detail. For example, the switching frequency of a CPU used in a recent personal computer is as high as 1 GHz or more. The power supply current of an LSI that allows such high speed switching contains a higher mode of harmonics of several GHz or more. However, the resonance frequency of a capacitor of about 0.1 µF, which is often used as a bypass capacitor in the current capacitor technology, is several ten MHz or less. In addition, inductance components due to the electrode pattern of the capacitor or lead wire are present in series in the capacitance component (the capacitor has an equivalent series inductance ESL). For these reasons, the bypass capacitor behaves as an inductor at a frequency equal to or higher than the series resonance frequency determined on the basis of the relationship to the capacitance, i.e., at a frequency more than several ten MHz, so the basic performance is lost. To allow an increase in speed of digital circuits in the future, increasing the frequency and decreasing the impedance in a wide frequency band are essential for a bypass capacitor. However, the likelihood that a high capacitance compact bypass capacitor having characteristics representing that the resonance frequency exceeds 1 GHz and a low impedance is exhibited in a wide frequency band will be developed as a practical product and become commercially available is very low.

SUMMARY OF THE INVENTION

The present invention has been made to solve the above problems, and has as its technical object to provide a transmission line type component which has a low impedance and can reliably and easily avoid the influence of a high frequency power supply current generated by high speed, high frequency operation of a high speed, high frequency circuit element.

It is another technical object of the present invention to provide a transmission line type component having a DC power supply line structure which has an EMI suppressing effect capable of suppressing generation of common mode noise due to a high frequency power supply current of a semiconductor LSI.

According to one exemplary embodiment of the present invention, there is provided a transmission line type component wherein a coaxial line is constructed by coaxially arranging a cylindrical external conductor which is formed from a conductive material and has a larger diameter than that of a columnar or cylindrical internal conductor so as to cover, via an insulating member, a surface of the internal conductor which is formed from a conductive material and extends in one axial direction, and a characteristic impedance of the coaxial line has a small value of not more than 100 mΩ.

According to one exemplary embodiment of the present invention, in the above transmission line type component, the internal conductor is constructed by integrally forming a first portion which is a portion covered with the insulating member, a second portion which extends from the first portion to a side of the external conductor while covering an end portion of the insulating member, and a third portion which extends from the second portion to be close to the side of the external conductor while having the same diameter as that of the external conductor.

According to one exemplary embodiment of the present invention, in one of the above transmission line type components, a three dimensional pattern formation process is executed for local portions opposing on a surface of the external conductor to increase a surface area in a shape of keeping uniform continuity of current propagation.

According to one exemplary embodiment of the present invention, in the above transmission line type component, at the local portions opposing on the surface of the external conductor, the insulating member is exposed to recess portions which are formed by the three dimensional pattern formation process.

According to one exemplary embodiment of the present invention, in the above transmission line type component, the local portions opposing on the surface of the external conductor serve as electrode terminals.

According to one exemplary embodiment of the present invention, in any one of the above transmission line type components, the insulating member is constructed as a thin intermediate layer. In this transmission line type component, preferably, the insulating member exhibits a high permittivity in a wide frequency band and has a relative permittivity of not less than 100 at a frequency of 1 MHz.

According to one exemplary embodiment of the present invention, in any one of the above transmission line type components, the insulating member exhibits a large dielectric loss in a wide frequency band. In this transmission line type component, for the insulating member, tan δ that indicates a gradient in characteristic of a transmission loss with respect to a use frequency is preferably not less than 1%.

According to one exemplary embodiment of the present invention, in any one of the above transmission line type components, an equivalent length including a wavelength compression effect by a dielectric in the internal conductor and the external conductor, which are arranged coaxially, is much larger than ¼ of a wavelength of an electromagnetic wave applied.

According to one exemplary embodiment of the present invention, in any one of the above transmission line type components, an electrical resistance value of the internal conductor and the external conductor, which are arranged coaxially, is not more than 100 mΩ at which a DC power supply current to be supplied to a semiconductor switching circuit can be sufficiently supplied.

According to one exemplary embodiment of the present invention, in any one of the above transmission line type components, the transmission line type component is used as a high frequency decoupling device coupled to a DC power supply distribution circuit of a semiconductor switching circuit.

According to one exemplary embodiment of the present invention, in any one of the above transmission line type components, the transmission line type component is inserted in series into a power supply line of a printed circuit board.

BRIEF DESCRIPTION OF DRAWINGS

FIG. 1 shows the basic arrangement of a transmission line type component according to an embodiment of the present invention, in which FIG. 1A is related to a perspective view of the outer appearance, FIG. 1B is related to a side sectional view, and FIG. 1C is related to a sectional view parallel to an end face taken along a line A–A' in FIG. 1B;

FIG. 2 shows the basic arrangement of a transmission line type component according to another embodiment of the present invention, in which FIG. 2A is related to a perspective view of the outer appearance, FIG. 2B is related to a side sectional view, and FIG. 2C is related to a sectional view parallel to an end face taken along a line A–A' in FIG. 2B;

FIG. 3 shows the outer appearance of a conventional cylindrical capacitor applied to manufacture the transmission line type component shown in FIG. 1 or 2, in which FIG. 3A is related to a side view, and FIG. 3B is related to a plan view in the direction of end face;

FIG. 4 is an equivalent circuit diagram of a decoupling circuit having an EMI suppressing effect, which is constituted by mounting the transmission line type component shown in FIG. 1 or 2 on a printed circuit board;

FIG. 7 shows a situation in which the transmission line type component shown in FIG. 2 is mounted in a semiconductor package, in which

BEST MODE FOR CARRYING OUT THE INVENTION

Figure 5:
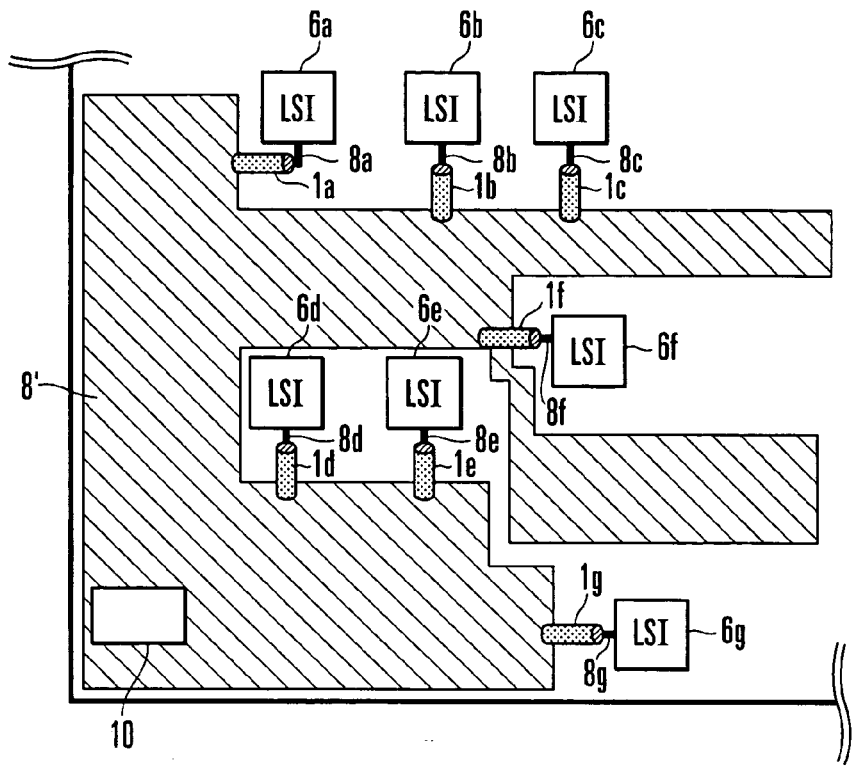
FIG. 5 is a plan view showing an example of wiring structure main part in a power supply layer portion when one of the transmission line type components shown in FIGS. 1 and 2 is selected and mounted on a multilayered printed circuit board on which LSIs are mounted, and wiring connection is done using power supply lines.

A transmission line type component according to one exemplary embodiment of the present invention will be described below in detail on the basis of embodiments with reference to the accompanying drawings.

FIG. 1 shows the basic arrangement of a transmission line type component 1 according to an embodiment of the present invention, in which FIG. 1A is related to a perspective view of the outer appearance, FIG. 1B is related to a side sectional view, and FIG. 1C is related to a sectional view parallel to an end face taken along a line A–A' in FIG. 1B.

The transmission line type component 1 is a component to be mounted on a printed circuit board. The transmission line type component 1 is suitably used as a high frequency decoupling device (decoupler) to be coupled to the DC power supply distribution circuit of a semiconductor switching circuit. As shown in FIGS. 1A, 1B, and 1C a coaxial line is formed by forming a signal conductor 2 serving as a cylindrical internal conductor which is formed from a conductive material and extends in one axial direction and coaxially arranging a ground conductor 3 serving as a cylindrical external conductor which is formed from a conductive material and having a diameter larger than that of the signal conductor 2 to cover the surface of the signal conductor 2 via a high-k insulating member 4, which has a relative dielectric constant ∈γ. The characteristic impedance of the coaxial line has a value as small as 100 mΩ or less. Further, as shown in FIG. 1B, a region of atmosphere "Air" may be located at the center of the signal conductor 2 serving as a cylindrical internal conductor.

The signal conductor 2 is constructed by integrally forming a first portion which is a portion covered with the high-k insulating member 4, a second portion which extends from the first portion to the ground conductor 3 side while covering the end portion of the high-k insulating member 4, and a third portion which extends from the second portion to be close to the ground conductor 3 side while having the same diameter as that of the ground conductor 3. If conductor portions of the signal conductor 2 and ground conductor 3, which are exposed to the outside, are regarded as external conductors from the viewpoint of outer appearance structure, three portions, i.e., the ground conductor 3 and the second and third portions of the signal conductor 2 are regarded as external conductors. In this case, the transmission line type component can also be explained as a structure in which, of the external conductors, the second portion of the signal conductor 2 is electrically connected to the first portion serving as the internal conductor.

As described above, when the external conductor is separated into three parts to form an electrode to be mounted on a printed circuit board, and the external conductors at the two end portion are electrically connected to the internal conductor, the structure can easily be connected in series to the DC power supply distribution circuit of a semiconductor switching circuit on the printed circuit board as a high frequency decoupling device (decoupler).

At any rate, in the transmission line type component 1, the high-k insulating member 4 is exposed to recess portions which are formed by executing a three dimensional pattern formation process for local portions opposing on the surface of the ground conductor 3 to increase the surface area in a shape of keeping the uniform continuity of current propagation. Accordingly, as shown in FIG. 1B, electrode terminals 5 are formed as electrodes to be mounted on the printed circuit board.

As described above, when the surface area of the ground conductor 3 is increased, the coaxial line length increases consequently. Hence, the uniform continuity of current propagation in the component is maintained. The three dimensional pattern formation process can be executed by etching or the like. Note that the uniform continuity of current propagation means that a current propagates in a predetermined mode because reflection in the propagation path is prevented by the three dimensional pattern formation process.

In addition, the high-k insulating member 4 is formed as a sufficiently thin intermediate layer and exhibits a high permittivity and large dielectric loss in a wide frequency band. The relative permittivity is 100 or more at a frequency of 1 MHz, and tan δ that indicates a gradient in the characteristic of a transmission loss with respect to a use frequency is 1% or more.

In this way, when the high-k insulating member 4 is made thin to decrease the characteristic impedance of the power supply wiring and exhibits a high permittivity and large dielectric loss in a wide frequency band, the characteristic impedance of the transmission line can be further decreased. The high frequency power supply current from the semiconductor switching circuit can be prevented, by the dielectric loss in the component, from leaking to the outside. In this case, a terminating process unique to use of a line can be omitted. In addition, when the impedance of the power supply line with respect to the DC power supply of the printed circuit board is designed to have a much larger value than that of the characteristic impedance of the transmission line type component 1, the transmittance of the high frequency power supply current can be reduced by the difference in impedance. As a result, the high frequency power supply current can be prevented from coupling to another circuit (LSI) on the printed circuit board or an external connector and leaking to the connection cable as a common mode current.

The equivalent length including the wavelength compression effect by the dielectric in the signal conductor 2 and ground conductor 3, which are arranged coaxially, is much larger than ¼ of the wavelength of an electromagnetic wave applied. The electrical resistance value in the signal conductor 2 and ground conductor 3 is 100 mΩ or less at which the DC power supply current to be supplied to the semiconductor switching circuit can be sufficiently supplied.

As described above, when the equivalent length including the wavelength compression effect by the dielectric in the signal conductor 2 and ground conductor 3 is much larger than ¼ of the wavelength of an electromagnetic wave applied, and the characteristic impedance is designed to have a sufficiently small value equal to or less than 100 mΩ over a wide frequency band, it is an ideal form of a DC power supply for a high speed, high frequency circuit element such as an LSI mounted on a printed circuit board.

It is effective to serially insert the transmission line type component 1 having the above arrangement into the power supply line of a printed circuit board. The reason for this is as follows. When the transmission line type component is parallelly inserted when the wiring length on the side of an LSI as a high speed, high frequency circuit element is not designed to be much less than the wavelength of the high frequency power supply current such that the wiring length can be regarded as a lumped constant, most of the high frequency power supply current generated from the LSI as an excitation source is reflected by the LSI side connection end of the component having a sufficiently low characteristic impedance. For this reason, most of the high frequency power supply current may flow to the power supply line having a higher characteristic impedance. When series insertion is set forth as a premise, the electrical resistance of the signal conductor 2 and ground conductor 3 must have a sufficiently small value equal to or less than 100 mΩ at which the DC power supply current to be supplied to the semiconductor switching circuit can sufficiently be supplied, as described above.

Furthermore, the power supply circuit of the printed circuit board on which the transmission line type component 1 is mounted is connected by a wiring that is sufficiently short so that it can be regarded as a lumped constant from the LSI to the LSI side port of the transmission line type component 1. The port on the opposite side (DC power supply side) of the transmission line type component 1 has a totally flat plane structure.

Such a structure has a significance in preventing the high frequency power supply current from the LSI from being reflected by the LSI side port of the transmission line type component 1 to prevent any reflected component from entering the transmission line type component 1. The structure aims at eliminating even a small component that enters the transmission line type component 1 by the dielectric loss and preventing the component from leaking outside from the transmission line type component 1. If the dielectric loss of the transmission line type component 1 is insufficient, an independent line structure which has a small DC voltage drop and is sufficiently separated from the receiving portion of the DC power supply is preferably formed for each circuit unit having an appropriate scale.

The reason why the transmission line type component 1 is designed to have a low impedance line structure is as follows. For a high speed, high frequency circuit element such as an LSI mounted on a printed circuit board, ideally, a DC power supply has an internal impedance with a sufficiently small value over a wide frequency band, and such a power supply is arranged for each high speed, high frequency circuit element. With this arrangement, a high frequency power supply current generated by the high speed, high frequency operation of the high speed, high frequency circuit element can be smoothly supplied, and as a result, the distortion of signal waveform can be suppressed. In addition, the voltage can be stabilized by sharing the DC power supply, thereby eliminating interference between the high speed, high frequency circuit elements.

To install independent power supplies is not practical because it increases the cost and size of a device and also increase the failure rate. Hence, as far as circumstances permit, one power supply for applying the same voltage is used in an electronic device having a relatively small scale. For example, a DC power supply for a printed circuit board is normally generated by a unit independent of the printed circuit board and supplied through an electric wire without any consideration of a high frequency.

When the transmission line type component 1 is inserted in series into the power supply line of the printed circuit board, the DC power supply to be supplied to the printed circuit board can be supplied to the high speed, high frequency circuit element in an almost ideal form in the printed circuit board.

In the above described transmission line type component 1, the signal conductor 2 (above described first portion) serving as an internal conductor has been described as a cylindrical shape. This portion may have a columnar shape. In the above description, the above described transmission line type component 1 is mounted on a printed circuit board. Instead, such a component may be made more compact and mounted on the lead of a power supply distribution circuit in a semiconductor package. In this case, a larger effect can be expected by mounting the component at a position closer to the high frequency power supply current source. When a conventional multilayered structure is applied to the structure of the power supply layer of the printed circuit board, the above described electrode structure to be mounted on the printed circuit board can be made simpler.

FIG. 2 shows the basic arrangement of a transmission line type component 1' according to another embodiment of the present invention, in which FIG. 2A is related to a perspective view of the outer appearance, FIG. 2B is related to a side sectional view, and FIG. 2C is related to a sectional view parallel to an end face taken along a line A–A' in FIG. 2B.

The transmission line type component 1' is also a component to be mounted on a semiconductor package. The transmission line type component 1' is suitably used as a high frequency decoupling device (decoupler) to be coupled to the DC power supply distribution circuit of a semiconductor switching circuit (directly connected to a power supply lead or ground lead in an LSI or the like). As shown in FIGS. 2A, 2B, and 2C a coaxial line is formed by forming a signal conductor 2' serving as a cylindrical internal conductor which is formed from a conductive material and extends in one axial direction and coaxially arranging a ground conductor 3' serving as a cylindrical external conductor which is formed from a conductive material and having a diameter larger than that of the signal conductor 2' to cover the surface of the signal conductor 2' via a high-k insulating member 4', which has a relative dielectric constant $\in\gamma$. The characteristic impedance of the coaxial line has a value as small as 100 mΩ or less. Further, as shown in FIG. 2B, a region of atmosphere "Air" may be located at the center of the signal conductor 2' serving as a cylindrical internal conductor.

As compared to the transmission line type component 1 of the embodiment described with reference to FIGS. 1A to 1C, the transmission line type component 1' has no electrode terminals 5 formed by executing a three dimensional pattern formation process for the external conductor. In addition, instead of separating the external conductor, a simple structure is formed by sequentially coaxially arranging the respective portions.

Even in the transmission line type component 1', the high-k insulating member 4' is formed as a sufficiently thin intermediate layer and exhibits a high permittivity and large dielectric loss in a wide frequency band. The relative permittivity is 100 or more at a frequency of 1 MHz, and tan δ that indicates a gradient in the characteristic of a transmission loss with respect to an operating frequency is 1% or more. The equivalent length including the wavelength compression effect by the dielectric in the signal conductor 2' and ground conductor 3', which are arranged coaxially, is much larger than ¼ of the wavelength of an electromagnetic wave applied. The electrical resistance value in the signal conductor 2' and ground conductor 3' is 100 mΩ or less at which the DC power supply current to be supplied to the semiconductor switching circuit can be sufficiently supplied. Even in the transmission line type component 1', the signal conductor 2' serving as an internal conductor has been described as a cylindrical shape. This portion may be formed into a columnar shape.

The above described transmission line type component 1 or 1' can easily be manufactured by applying a conventional manufacturing process technique for a cylindrical capacitor used for high frequency applications of television, tuners, cellular phones, and the like.

FIG. 3 shows the outer appearance of a conventional cylindrical capacitor applied to manufacture the transmission line type component 1 or 1', in which FIG. 3A is related to a side view, and FIG. 3B is related to a plan view in the direction of end face.

This cylindrical capacitor is constructed by forming a cylindrical electrode terminal 18 which is formed from a conductive material and extends in one axial direction and coaxially arranging a resin coat 17 having a cylindrical shape with a larger diameter than that of the electrode terminal 18 on the entire outer side surface of the electrode terminal 18 except the two end portions of the surface and the local portions of the outer side surface near the end portions. In this exemplified case, a length L of the electrode terminal 18 in one axial direction is about 2.0 mm, a width W of the exposed portion of the electrode terminal 18 on each of the two sides in one axial direction is about 0.3 mm, as shown in FIG. 3A, and a diameter φD of the resin coat 17 is about 1.25 mm, as shown in FIG. 3B.

In any case, the transmission line type component 1 or 1' has a coaxial line structure used in a communication device such as a microwave device, as shown in FIGS. 1A to 1C or FIGS. 2A to 2C. Accordingly, the leakage electromagnetic field from the transmission line is suppressed.

FIG. 4 is an equivalent circuit diagram of a decoupling circuit having an EMI suppressing effect, which is constituted by mounting the above described transmission line type component 1 or 1' on a printed circuit board.

In this decoupling circuit, the transmission line type component 1 or 1' is inserted in series between the power supply ports of an LSI 6 and a power supply line 8 and ground line 9 connected to a DC power supply (DC source) on the printed circuit board. With this arrangement, most of the high frequency power supply current generated by the LSI 6 upon high speed switching operation is reflected on the power supply ports of the LSI 6, and part of the high frequency power supply current that enters the transmission line type component 1 or 1' is consumed by the dielectric loss, thereby implementing a function of preventing the high frequency power supply current from reaching the power supply line 8 of the printed circuit board outside a terminal capacitor 7. However, a DC current from the DC power supply (DC source) is directly passed and supplied to the LSI 6.

Figure 10:
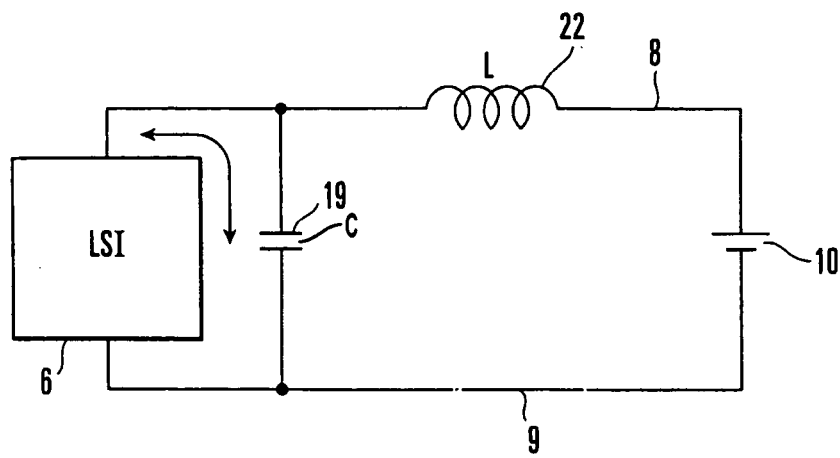
FIG. 10 is a circuit diagram showing the basic arrangement of a conventional decoupling circuit having an EMI suppressing effect.
Figure 11:
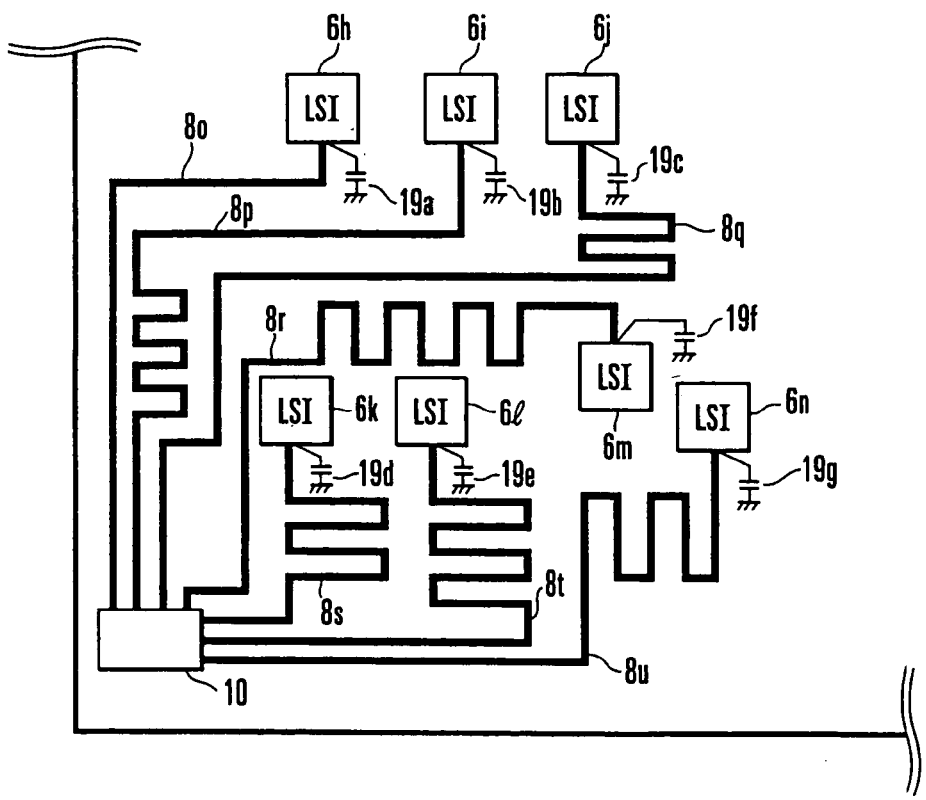
FIG. 11 is a plan view showing the arrangement of main part of a conventional multilayered printed circuit board incorporating a high-k dielectric and having a DC power supply line, which has an EMI suppressing effect.
Figure 12:
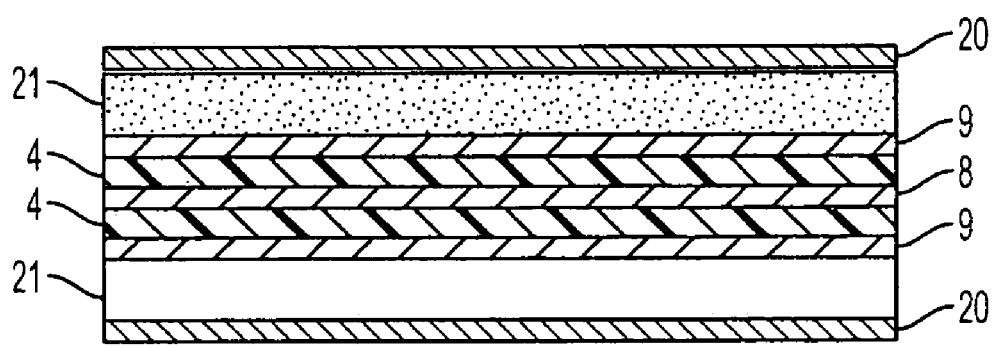
FIG. 12 is a side sectional view showing the basic structure of main part of the multilayered printed circuit board incorporating a high-k dielectric shown in FIG. 11.

In mounting a bypass capacitor 19 in the conventional decoupling circuit described with reference to FIG. 10, the bypass capacitor 19 is inserted between the power supply line 8 and the ground line 9 to be parallel to the power supply line 8. When the transmission line type component 1 or 1' is to be mounted on the printed circuit board, the transmission line type component 1 or 1' is inserted in series between the power supply line 8 and ground line 9 and the power supply ports of the LSI 6. With this arrangement, even when the wiring length of the input terminal in the LSI 6 and transmission line type component 1 or 1' is not designed to be much less than the wavelength of the high frequency current such that the wiring length can be regarded as a lumped constant, a problem in that most of the high frequency power supply current from the LSI 6 serving as an excitation source is reflected by the connection terminal on the LSI 6 side of the transmission line type component 1 or 11 having a sufficiently low characteristic impedance, and most of the high frequency power supply current flows to the power supply distribution line having a higher characteristic impedance can be solved.

FIG. 5 is a plan view showing an example of a wiring structure in a power supply layer portion when one of the above described transmission line type components 1 and 1' is selected as each of a plurality of (a total of seven) transmission line type components 1a to 1g and mounted on a multilayered printed circuit board on which a plurality of (a total of seven) LSIs 6a, 6b, 6c, 6d, 6e, 6f and 6g are mounted, and wiring connection is done using a plurality of (a total of seven) power supply lines 8a, 8b, 8c, 8d, 8e, 8f and 8g.

In the power supply layer in this multilayered printed circuit board, portions from the power supply terminals of the LSIs 6a, 6b, 6c, 6d, 6e, 6f and 6g to the ports of the transmission line type components 1a, 1b, 1c, 1d, 1e, 1f and 1g on the sides of the LSIs 6a, 6b, 6c, 6d, 6e, 6f and 6g are formed as wires to arrange the power supply lines 8a, 8b, 8c, 8d, 8e, 8f and 8g. A portion from the opposite side ports of the transmission line type components 1a, 1b, 1c, 1d, 1e, 1f and 1g on the side of a DC power supply 10 to the DC power supply 10 is formed as a power supply plate (plane) 8'.

In this multilayered printed circuit board, the high frequency power supply current from the LSIs 6a, 6b, 6c, 6d, 6e, 6f and 6g is totally eliminated by the dielectric loss in the transmission line type components 1a, 1b, 1c, 1d, 1e, 1f and 1g and therefore does not leak to the outside.

Even with this arrangement, however, if the dielectric loss in the transmission line type components 1a, 1b, 1c, 1d, 1e, 1f and 1g is insufficient, a slight high frequency power supply current may leak from the transmission line type components 1a, 1b, 1c, 1d, 1e, 1f and 1g.

Figure 6:
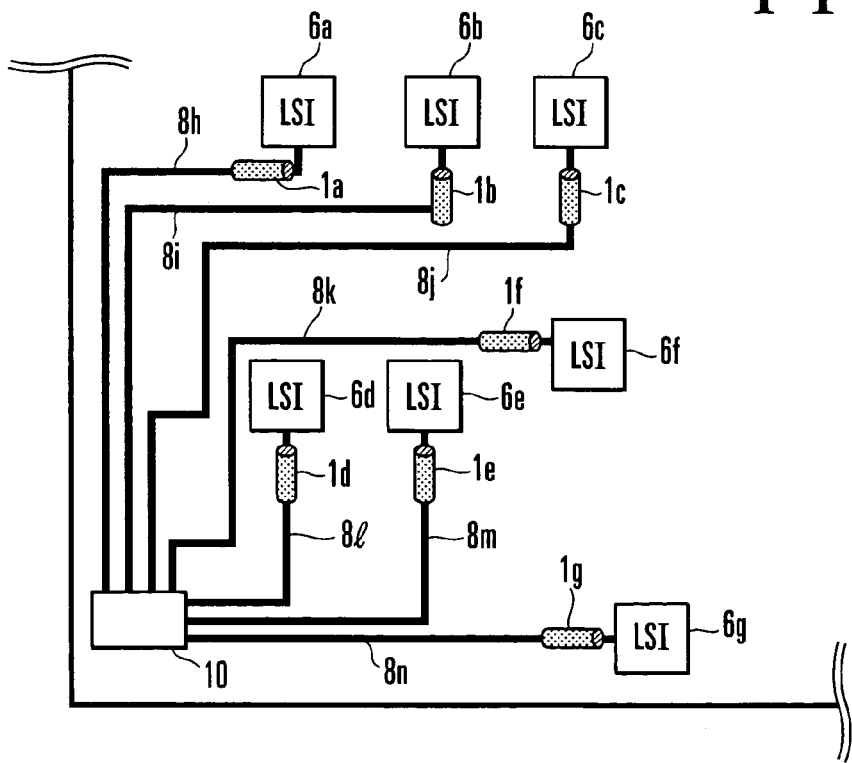
FIG. 6 is a plan view showing another example of wiring structure main part in a power supply layer portion when one of the transmission line type components shown in FIGS. 1 and 2 is selected and mounted on a multilayered printed circuit board on which LSIs are mounted, and wiring connection is done using power supply lines.

FIG. 6 is a plan view showing another example of a wiring structure in a power supply layer portion when one of the above described transmission line type components 1 and 1' is selected as each of the plurality of (the total of seven) transmission line type components 1a, 1b, 1c, 1d, 1e, 1f and 1g and mounted on a multilayered printed circuit board on which the plurality of (the total of seven) LSIs 6a, 6b, 6c, 6d, 6e, 6f and 6g are mounted, and wiring connection is done using the plurality of (the total of seven) power supply lines 8h, 8i, 8j, 8k, 8l, 8m and 8n.

In the power supply layer in this multilayered printed circuit board, portions from the DC power supply 10 to the ports of the transmission line type components 1a, 1b, 1c, 1d, 1e, 1f and 1g on the DC power supply side are formed as wires in a one to one correspondence to arrange the power supply lines 8h, 8i, 8j, 8k, 8l, 8m and 8n. Hence, while apparently individually providing the ideal DC power supplies 10, any runaround of a leaking high frequency power supply current into other circuits (LSIs 6a, 6b, 6c, 6d, 6e, 6f and 6g) can be prevented.

Figure 7A:
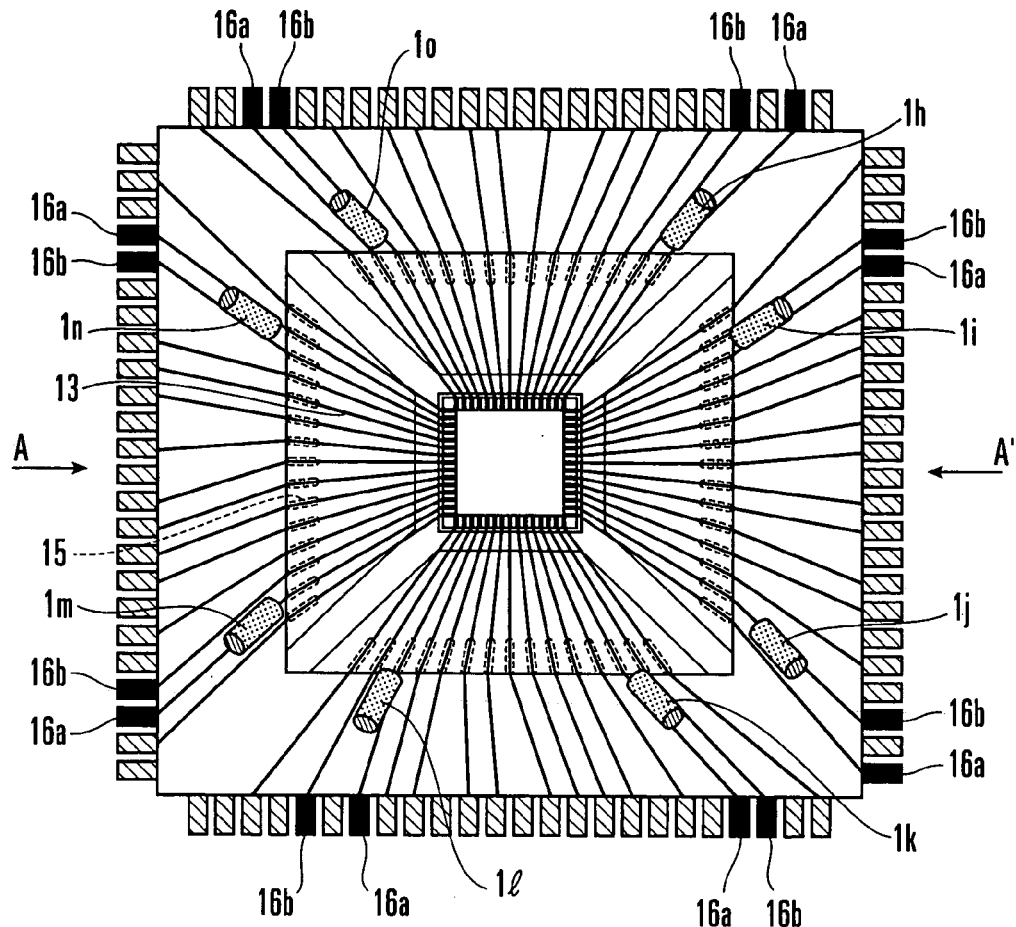
FIG. 7A is related to a plan view from the upper side.
Figure 7B:
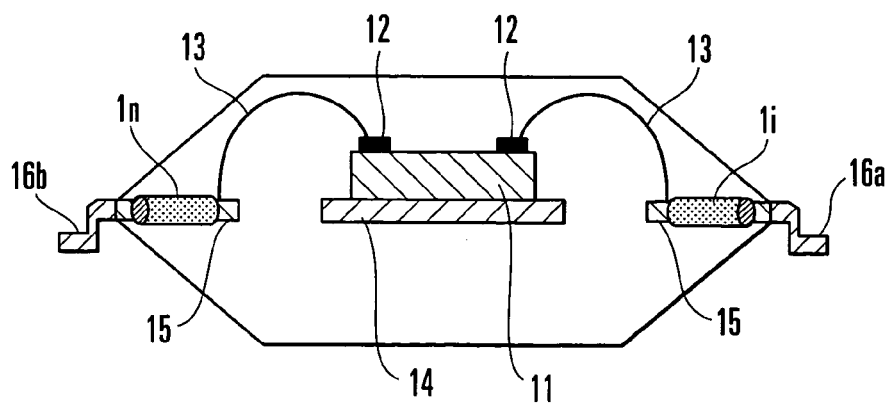
FIG. 7B is related to a side sectional view taken along a line A–A' in FIG. 7A to show part (main part) extracted.

FIG. 7 shows a situation in which the above described transmission line type component 1' is selected as each of a plurality of (a total of eight) transmission line type components 1h, 1i, 1j, 1k, 1l, 1m, 1n, and 1o and mounted in a semiconductor package, in which FIG. 7A is related to a plan view from the upper side, and FIG. 7B is related to a side sectional view taken along a line A–A' in FIG. 7A to show part (main part) extracted.

In this semiconductor package, the total of eight transmission line type components 1h, 1i, 1j, 1k, 1l, 1m, 1n, and 1o are directly connected to the power supply lead wires and ground lead wires connected to power supply terminals 16a and ground terminals 16b, which are paired and arranged at a total of eight portions adjacent or almost adjacent to the periphery portion of the package main body. A plurality of leads 15 connected to the distal end sides of the power supply lead wires and ground lead wires and the distal end sides of a plurality of signal lead wires connected to terminals at other portions of the peripheral portion of the package main body are connected to a plurality of bonding pads 12 (see FIG. 7B) arranged at the peripheral portion of a pellet 11 (see FIG. 7B) mounted on a die pad 14 (see FIG. 7B) through a plurality of bonding wires 13. The transmission line type components 1h, 1i, 1j, 1k, 1l, 1m, 1n, and 1o are arranged at positions closer to the high frequency power supply current sources to take a measure against the high frequency power supply current.

Figure 8:
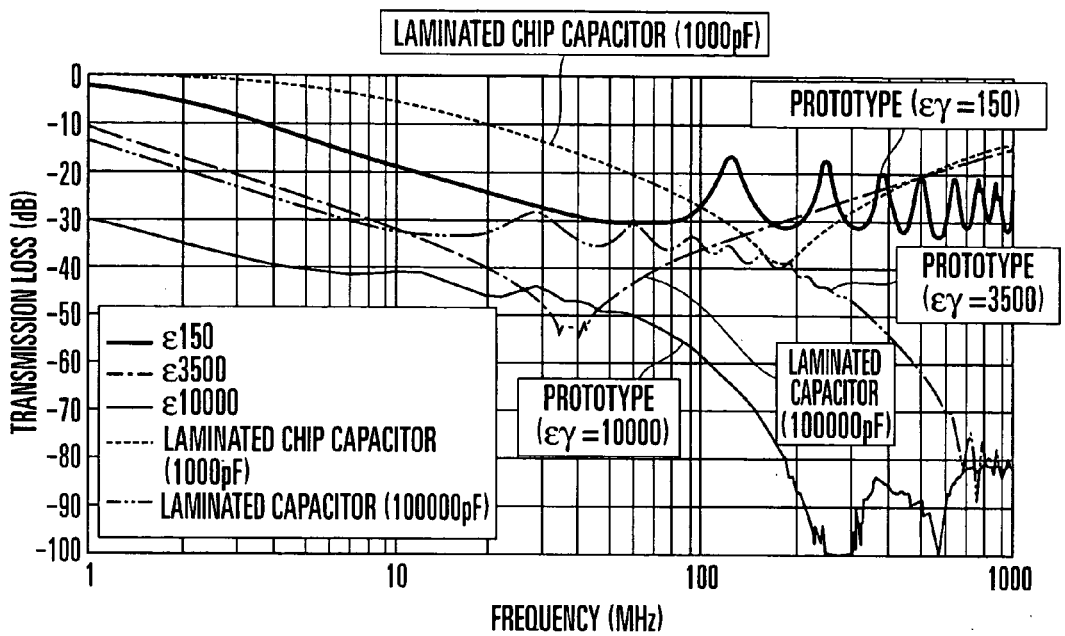
FIG. 8 shows the relationship between a frequency and a transmission loss, which is obtained by comparing the transmission characteristics of three prototypes of the transmission line type component shown in FIG. 2, which are prepared using materials having different relative permittivities, with those of two laminated chip capacitors which have different electrostatic capacitances and are used as conventional bypass capacitors.

FIG. 8 shows the relationship between a frequency (MHz) and a transmission loss (dB), which is obtained by setting the total length (line length) of the above described transmission line type component 1' to about 100 mm and comparing the transmission characteristics (so called S21 characteristics) of three prototypes prepared using materials having different relative permittivities ∈r of 150, 3,500, and 10,000 with those of two laminated chip capacitors which have different electrostatic capacitances of 1,000 pF and 100,000 pF and are used as conventional bypass capacitors. The transmission characteristics here are measured using a network analyzer (HP8753D).

As is apparent from FIG. 8, each prototype has a very large transmission loss in a wide frequency band as compared to each laminated chip capacitor. In other words, the impedance from a low frequency to a high frequency is very low. In addition, in the prototypes, the higher the relative permittivity ∈r becomes, the larger transmission loss conspicuously becomes. Especially, when relative permittivity ∈r=10000, the impedance decreases by three orders of magnitude at about 100 MHz.

All the prototypes have a total length of about 100 mm, and it is difficult to directly mount them on a printed circuit board. However, when the thickness of the high-k insulating member 4' is decreased, or a high-k material having a satisfactory frequency characteristic is used to decrease the capacitance of the transmission line type component 1', the total length can be decreased while maintaining the same transmission characteristic. The transmission characteristic here indicates a characteristic from a low frequency. When the transmission line type component 1' is defined as a component compatible with a high speed LSI of, e.g., 100 MHz or more (the lower limit of the applied frequency is set to several MHz to 100 MHz), and the wavelength compression effect of a high-k material is taken into consideration, the total length can be reduced to a length for practical use.

From this viewpoint, a prototype having a total length of 5.4 mm, i.e., having a total length that was reduced to a level applicable for mounting on a printed circuit board was prepared.

Figure 9:
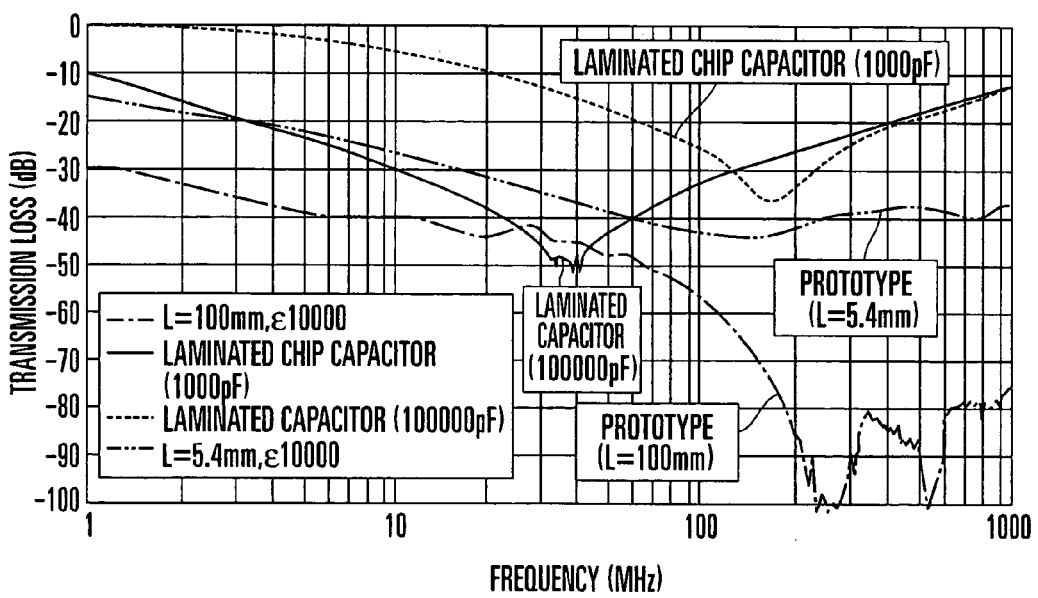
FIG. 9 is a graph showing the relationship between a frequency and a transmission loss, which is obtained by comparing the transmission characteristic of a prototype of the transmission line type component shown in FIG. 2, which is prepared by reducing the total length, with those of a prototype which has the same relative permittivity as that of the above prototype and the same total length as that shown in FIG. 8 and a laminated chip capacitor which has an electrostatic capacitance of 100,000 pF and is used as a conventional bypass capacitor.

FIG. 9 shows the relationship between a frequency (MHz) and a transmission loss (dB), which is obtained by comparing the transmission characteristic (so called S21 characteristic) of a prototype prepared by reducing the total length (line length) L of the above described transmission line type component 1' to 5.4 mm and setting the relative permittivity $\in r$ to 10,000 with those of the prototype shown in FIG. 8, which has a total length (line length) L of 100 mm and has the same relative permittivity $\in r$ of 10,000 and a laminated chip capacitor which has an electrostatic capacitance of 100,000 pF and is used as a conventional bypass capacitor, and a laminated chip capacitor which has an electrostatic capacitance of 1,000 pF. The transmission characteristics here are also measured using a network analyzer (HP8753D).

As is apparent from FIG. 9, when the prototype having a smaller total length is compared with the prototype having a predetermined length (unchanged total length), a line having a small transmission loss is formed because the dielectric loss decreases as the total length (line length) becomes small. When the lower limit frequency is set to 100 MHz, the characteristic impedance of the line decrease by about two orders of magnitude.

In any case, when the above described transmission line type components 1 and 1' and the printed circuit board or semiconductor package on which the transmission line type component is mounted have the above described arrangements, ideal DC power supplies can be apparently individually provided to a high speed, high frequency circuit element such as an LSI. For this reason, the high frequency power supply current generated from the high speed, high frequency circuit element upon high speed switching operation can be eliminated by the dielectric loss in the transmission line type component 1 or 1' so the electromagnetic coupling between the power supply line 8 and a signal line and the leakage of the high frequency power supply current from the power supply line 8 of the printed circuit board to the power supply cable in the device can be suppressed. Accordingly, while promoting high speed, high frequency operation of a high speed, high frequency circuit element mounted on a printed circuit board, a sufficient EMI suppressing effect can be ensured by suppressing electromagnetic radiation from a high speed, high frequency electronic device represented by a digital device. In addition, durability against external electric or electromagnetic disturbance can be increased.

As described above, according to the above described embodiments, when a cylindrical external conductor which is formed from a conductive material and has a larger diameter than that of an internal conductor is coaxially arranged to cover, via a high-k insulating member, the surface of the internal conductor formed from a conductive material, a coaxial line having a very low characteristic impedance is formed. When this line is inserted in series between the power supply line of a printed circuit board and the power supply port of a high speed, high frequency circuit element such as an LSI, a DC power supply can be supplied as if independent power supplies having a low impedance were individually provided for the respective high speed, high frequency circuit elements mounted on the printed circuit board. In addition, the high frequency power supply current generated from the high speed, high frequency circuit element upon high speed switching operation is eliminated by the dielectric loss in the transmission line type component so the electromagnetic coupling between the power supply line and a signal line and the leakage of the high frequency power supply current from the power supply line of the printed circuit board to the power supply cable in a device can be suppressed. As a result, while promoting high speed, high frequency operation of the high speed, high frequency circuit element mounted on the printed circuit board, a sufficient EMI suppressing effect can be ensured by suppressing electromagnetic radiation from a high speed, high frequency electronic device represented by a digital device. In addition, durability against external electric or electromagnetic disturbance can be increased. That is, this transmission line type component has a low impedance and can therefore reliably and easily avoid the influence of the high frequency power supply current generated by the high speed, high frequency operation of the high speed, high frequency circuit element. Especially when the transmission line type component is mounted in a semiconductor package serving as a high frequency power supply current source, a larger effect can be obtained.

As has been described above, the transmission line type component 1 or 1' according to one exemplary embodiment of the present invention can suitably be used as a high frequency decoupling device (decoupler) coupled to the DC power supply distribution circuit of, e.g., a printed semiconductor switching circuit.

The invention claimed is:

1. A transmission line type component including a coaxial line comprising:
   a cylindrical external conductor which comprises a conductive material;
   a columnar or cylindrical internal conductor which comprises a conductive material and extends in one axial direction; and
   an insulating member;
   wherein the external conductor, the internal conductor, and the insulating member are arranged coaxially;
   wherein the external conductor has a larger diameter than a diameter of the internal conductor;
   wherein the insulating member covers a surface or the internal conductor; and
   wherein a characteristic impedance of the coaxial line has a value of not more than 100 mΩ.

2. A transmission line type component according to claim 1, wherein the internal conductor is an integral structure with:
   a first portion which is a portion covered with the insulating member;
   a second portion which extends from the first portion to a side of the external conductor while covering an end portion of the insulating member; and
   a third portion which extends from the second portion to be close to the side of the external conductor while having the same diameter as that of the external conductor.

3. A transmission line type component according to claim 2, wherein a three dimensional pattern formation process is executed to form opposing portions, wherein said opposing portions are portions on a surface of the external conductor, so as to increase a surface area in a shape of the external conductor while maintaining uniform continuity of current propagation.

4. A transmission line type component according to claim 3, wherein at the opposing portions on the surface of the external conductor, the insulating member is exposed to recess portions which are formed by the three dimensional pattern formation process.

5. A transmission line type component according to claim 4, wherein the opposing portions on the surface of the external conductor serve as electrode terminals.

6. A transmission line type component according to claim 1, wherein the insulating member comprises a thin intermediate layer.

7. A transmission line type component according to claim 6, wherein the insulating member exhibits a high permittivity in a wide frequency band.

8. A transmission line type component according to claim 7, wherein the insulating member has a relative permittivity of not less than 100 at a frequency of 1 MHz.

9. A transmission line type component according to claim 6, wherein the insulating member exhibits a large dielectric loss in a wide frequency band.

10. A transmission line type component according to claim 9, wherein with respect to the insulating member, tan δ, which indicates a gradient characteristic of a transmission loss with respect to an operating frequency, is not less than 1%.

11. A transmission line type component according to claim 1, wherein an equivalent length, including a wavelength compression effect provided by the insulating member the internal conductor and the external conductor, which are arranged coaxially, is much larger than ¼ of a wavelength of an electromagnetic wave applied.

12. A transmission line type component according to claim 1, wherein an electrical resistance value of the internal conductor and the external conductor, which are arranged coaxially, is not more than 100 mΩ at which a DC power supply current to be supplied to a semiconductor switching circuit can be sufficiently supplied.

13. A transmission line type component according to claim 1, wherein the transmission line type component is used as a high frequency decoupling device coupled to a DC power supply distribution circuit of a semiconductor switching circuit.

14. A transmission line type component according to claim 1, wherein the transmission line type component is inserted in series into a power supply line of a printed circuit board.

* * * * *